US012269229B2

(12) United States Patent
Roobol et al.

(10) Patent No.: US 12,269,229 B2
(45) Date of Patent: Apr. 8, 2025

(54) REFLECTOR MANUFACTURING METHOD AND ASSOCIATED REFLECTOR

(71) Applicant: ASML Netherlands B.V., Veldhoven (NL)

(72) Inventors: Sander Bas Roobol, Veldhoven (NL); Sietse Thijmen Van Der Post, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 495 days.

(21) Appl. No.: 17/433,774

(22) PCT Filed: Jan. 28, 2020

(86) PCT No.: PCT/EP2020/051986
§ 371 (c)(1),
(2) Date: Aug. 25, 2021

(87) PCT Pub. No.: WO2020/173640
PCT Pub. Date: Sep. 3, 2020

(65) Prior Publication Data
US 2022/0134693 A1    May 5, 2022

(30) Foreign Application Priority Data
Feb. 26, 2019    (EP) .................... 19159257

(51) Int. Cl.
*B29D 11/00*    (2006.01)
*G03F 7/00*    (2006.01)
(52) U.S. Cl.
CPC ........ *B29D 11/0074* (2013.01); *G03F 7/0005* (2013.01); *G03F 7/7085* (2013.01)

(58) Field of Classification Search
CPC . B29D 11/0074; G03F 7/0005; G03F 7/7085; G03F 7/70616; B32B 2457/14;
(Continued)

(56) References Cited

U.S. PATENT DOCUMENTS 4,927,480 A    5/1990    Vaughan
5,724,187 A    3/1998    Varaprasad et al.
(Continued)

FOREIGN PATENT DOCUMENTS

CN    108319033 A    7/2018
EP    1 628 164 A    2/2006
(Continued)

OTHER PUBLICATIONS

Brenner et al. "First results from the online variable line spacing grating spectrometer at FLASH" Nuclear Instruments and Methods in Physics Research A. Available since Oct. 1, 2010. (Year: 2010).*
(Continued)

*Primary Examiner* — Alex B Efta
*Assistant Examiner* — Alexander S Wright
(74) *Attorney, Agent, or Firm* — Sterne, Kessler, Goldstein & Fox PLLC

(57) ABSTRACT

Disclosed is a method of manufacturing a reflector. The method comprises polishing (520) at least the uppermost surface of the uppermost substantially flat substrate of a plurality of substantially flat substrates, deforming (530) each substantially flat substrate into the desired shape, and bonding (540) the deformed substrates together to form said reflector. In an embodiment, the deforming and bonding is performed together using a mold.

14 Claims, 3 Drawing Sheets

(58) Field of Classification Search
CPC ..... B32B 17/06; B32B 38/1866; B32B 38/00; B29C 65/48; B29C 65/02; B29C 2059/027; B29C 2038/0064; H01L 24/80
See application file for complete search history.

(56) References Cited

U.S. PATENT DOCUMENTS

| | | |
|---|---|---|
| 6,952,253 B2 | 10/2005 | Lof et al. |
| 6,961,116 B2 | 11/2005 | Den Boef et al. |
| 7,265,364 B2 | 9/2007 | Teunissen et al. |
| 7,646,471 B2 | 1/2010 | Teunissen et al. |
| 7,701,577 B2 | 4/2010 | Straaijer et al. |
| 7,791,724 B2 | 9/2010 | Den Boef et al. |
| 8,115,926 B2 | 2/2012 | Straaijer |
| 8,553,227 B2 | 10/2013 | Jordanoska |
| 8,681,312 B2 | 3/2014 | Straaijer |
| 8,692,994 B2 | 4/2014 | Straaijer |
| 8,792,096 B2 | 7/2014 | Straaijer |
| 8,797,554 B2 | 8/2014 | Straaijer |
| 8,823,922 B2 | 9/2014 | Den Boef |
| 9,417,515 B2 | 8/2016 | Barman et al. |
| 9,581,890 B2 | 2/2017 | Hofmann et al. |
| 9,739,913 B2 | 8/2017 | Beasley et al. |
| 10,067,074 B2 | 9/2018 | Quintanilha et al. |
| 10,338,484 B2 | 7/2019 | Den Boef et al. |
| 10,423,073 B2 | 9/2019 | Enkisch et al. |
| 2006/0018045 A1 | 1/2006 | Moeller et al. |
| 2007/0224518 A1 | 9/2007 | Yokhin et al. |
| 2010/0233600 A1 | 9/2010 | Den Boef et al. |
| 2010/0328655 A1 | 12/2010 | Den Boef |
| 2011/0026032 A1 | 2/2011 | Den Boef et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2013/0162996 A1 | 6/2013 | Straaijer et al. |
| 2013/0304424 A1 | 11/2013 | Bakeman et al. |
| 2014/0019097 A1 | 1/2014 | Bakeman et al. |
| 2015/0261097 A1 | 9/2015 | Mathijssen et al. |
| 2016/0161863 A1 | 6/2016 | Den Boef et al. |
| 2016/0370717 A1 | 12/2016 | Den Boef et al. |
| 2016/0372628 A1 | 12/2016 | Henley et al. |
| 2017/0003419 A1 | 1/2017 | Jaiswal |
| 2017/0184981 A1 | 6/2017 | Quintanilha et al. |
| 2018/0074236 A1 | 3/2018 | Fischer et al. |
| 2018/0239160 A1 | 8/2018 | Roobol et al. |
| 2018/0364588 A1 | 12/2018 | Socha |

FOREIGN PATENT DOCUMENTS

| | | |
|---|---|---|
| EP | 2 843 687 A1 | 3/2015 |
| JP | H08-201592 A | 8/1996 |
| JP | H10-189406 A | 7/1998 |
| JP | 2006-173446 A | 6/2006 |
| JP | 2006-287082 A | 10/2006 |
| JP | 2017-506363 A | 3/2017 |
| JP | 2018-509609 A | 4/2018 |
| TW | I308771 B | 4/2009 |
| TW | 2016-06358 A | 2/2016 |
| TW | 2017-08846 A | 3/2017 |
| TW | I604228 B | 11/2017 |
| TW | I631411 B | 8/2018 |
| WO | WO 2011/012624 A1 | 2/2011 |
| WO | WO 2016/102127 A1 | 6/2016 |

OTHER PUBLICATIONS

Joseph J. Brown and Victor M. Bright. "Thermal Actuators" Department of Mechanical Engineering, University of Colorado. Copyrighted by Springer Science+Business Media in 2015 (shown in first page). (Year: 2015).*

Kanaoka et al., "Figureing and smoothing capabilities of elastic emission machining for low-thermal-expansion glass optics", Dec. 7, 2007, Journal of Vacuum Science and Technology B, Edition 25, 2110-2113. (Year: 2007).*

International Search Report and Written Opinion of the International Searching Authority directed to related International Patent Application No. PCT/EP2020/051986, mailed May 12, 2020; 12 pages.

International Preliminary Report on Patentability directed to related International Patent Application No. PCT/EP2020/051986, issued Aug. 25, 2021; 8 pages.

Beijersbergen et al., "Silicon pore optics: novel lightweight high-resolution x-ray optics developed for XEUS," Proc. of SPIE, vol. 5488, UV and Gamma-Ray Space Telescope Systems, Oct. 11, 2004; 7 pages.

Petre R., "Thin Shell, Segmented X-Ray Mirrors," X-Ray Optics and Instrumentation, vol. 2010, Feb. 9, 2011; 16 pages.

Collon et al., "Silicon Pore Optics development for ATHENA," Proc. of SPIE, vol. 9603, Optics for EUV, X-Ray, and Gamma-Ray Astronomy VII, Sep. 4, 2015; pp. 1-11.

* cited by examiner

REFLECTOR MANUFACTURING METHOD AND ASSOCIATED REFLECTOR

CROSS-REFERENCE TO RELATED APPLICATIONS

This application claims priority of EP application 19159257.5 which was filed on Feb. 26, 2019 and which is incorporated herein in its entirety by reference.

FIELD

The present invention relates to an optical system and associated methods for, but not exclusively, a metrology apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

A metrology apparatus, or an inspection apparatus, may be used to determine characteristics of the pattern manufactured on the substrate by the lithographic apparatus. Today many forms of optical metrology technologies are known and with shrinking critical dimensions in the manufactured patterns, these optical metrology technologies may lack resolution. An option is to use in such a metrology apparatus a radiation that has relatively low wavelengths, for example, in the soft X-ray or Extreme Ultraviolet (EUV) spectral range. The relatively low wavelengths may be in the range from 0.1 nm to 100 nm, or in the range from 1 nm to 50 nm, or in the range from 10 nm to 20 nm. One may generate radiation in such wavelengths by using the principle of Higher Harmonic Generation (HHG): short pulses of infrared (IR) radiation are focused in a HHG medium (for example a specific gas) and the HHG medium converts a portion of the received IR radiation towards soft X-ray or EUV radiation. The radiation that is generated by HHG may comprise multiple peaks at different wavelengths in a relatively broad spectrum.

In the metrology apparatus a beam of radiation is directed by an illumination sub-system towards a region of interest on the substrate. At the region of interest is provided, for example, a target. Preferably the beam of radiation is focused on the region of interest or the target. Such an illumination sub-system may comprise reflective optical components, i.e., reflectors or mirrors, which direct the beam of radiation e.g., at a grazing incidence. Such mirrors may be capable of directing soft X-ray and/or EUV spectral range broadband radiation onto a sensor, and in some cases may be capable of focusing such broadband radiation.

It would be desirable to improve on present methods of manufacturing such mirrors.

SUMMARY

According to an aspect or embodiment, there is comprised method of manufacturing a reflector comprising: polishing at least the uppermost surface of the uppermost substantially flat substrate of a plurality of substantially flat substrates; deforming each substantially flat substrate into the desired shape, and bonding the deformed substrates together to form said reflector.

Also disclosed is a reflector manufactured to such a method, and an illumination sub-system, metrology apparatus and lithography apparatus comprising such a reflector.

At least one feature of any aspect or embodiment described herein may replace any corresponding feature of any aspect or embodiment described herein. At least one feature of any aspect or embodiment described herein may be combined with any other aspect or embodiment described herein.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable reflector array and a programmable LCD array.

Figure 1:
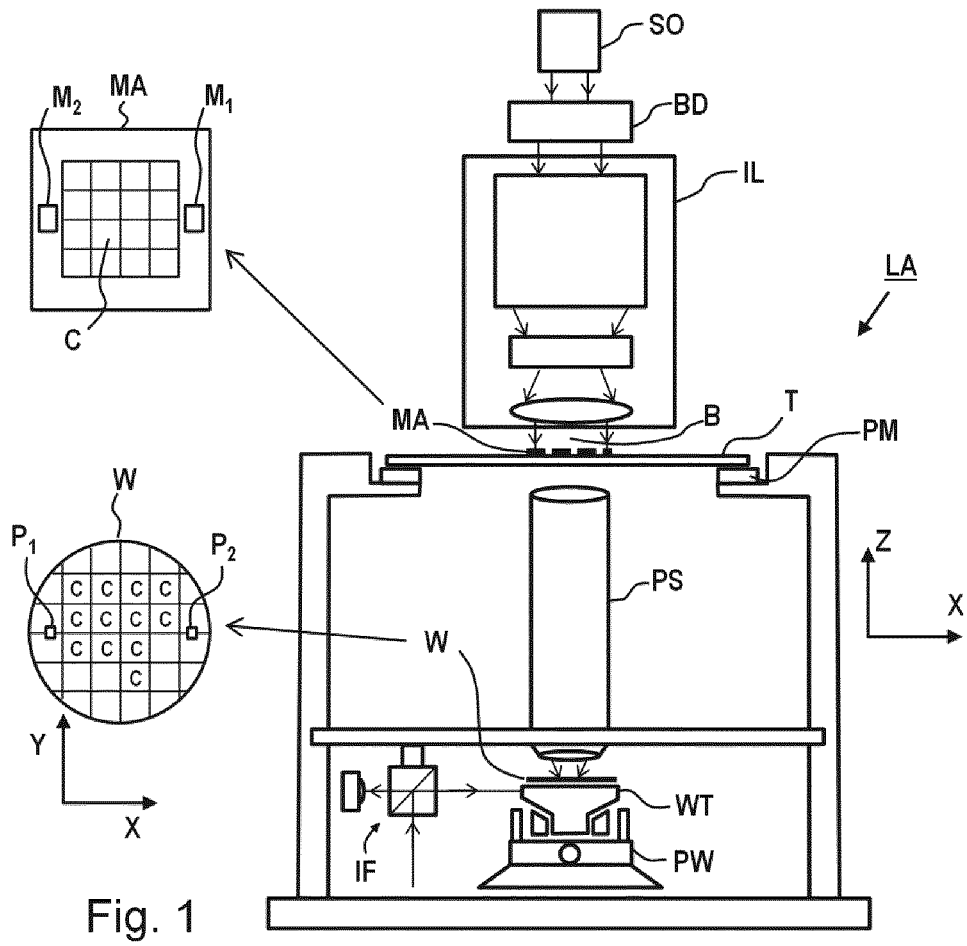
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M'1, M'2 and substrate alignment marks P'1, P'2. Although the substrate alignment marks P'1, P'2 as illustrated occupy dedicated target portions, they may be located in spaces between target portions. Substrate alignment marks P'1, P'2 are known as scribe-lane alignment marks when these are located between the target portions C.

Figure 2:
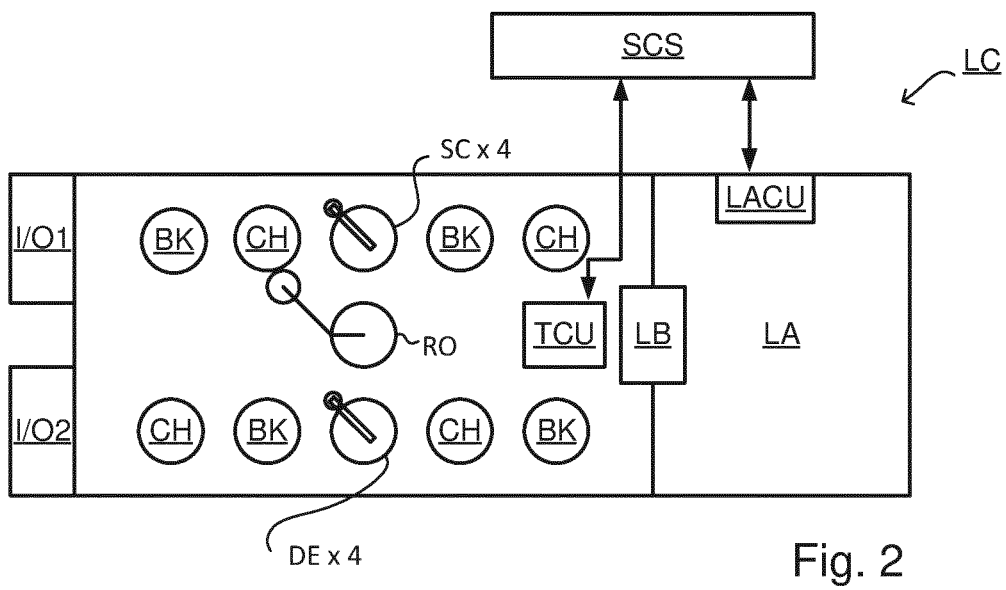
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line-widths, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus or metrology tool MT, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
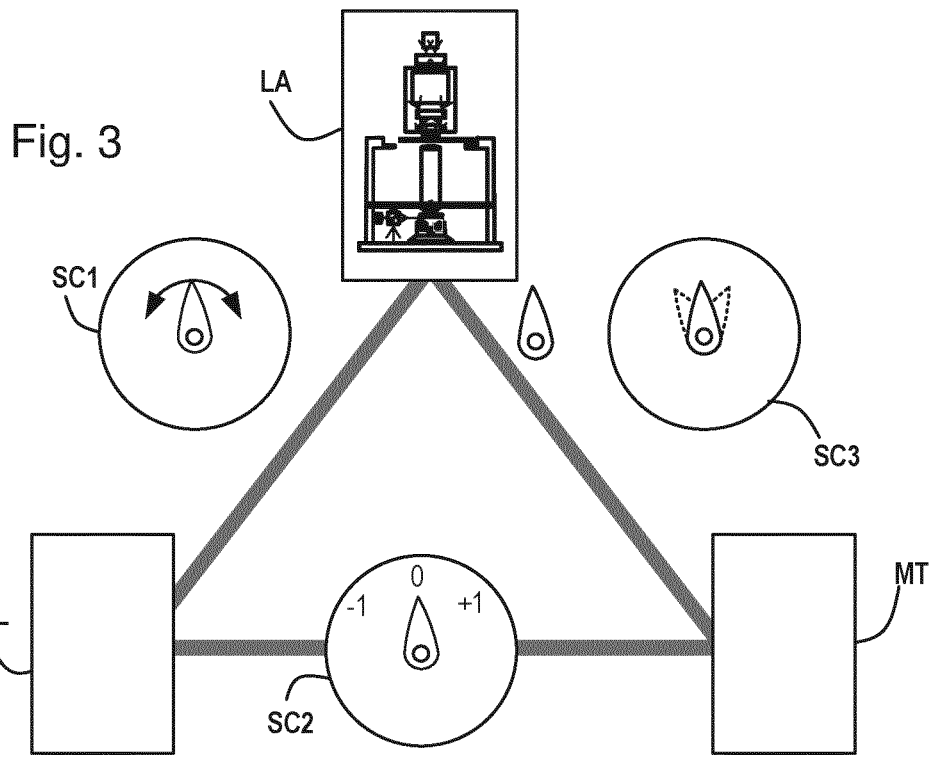
FIG. 3 depicts a schematic representation of holistic lithography, representing cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary. The metrology tool MT may provide information that can be used for multiple purposes. The information provided by the metrology tool MT depends on the stage at which metrology measurements are performed in the manufacturing process. It is possible to create a feedback loop between the metrology tool MT and other tools used in the manufacturing process, for example, as part of the lithography, etch or chemical-mechanical polishing (CMP) steps. Information provided by aspects or embodiments of the present invention may be used by the metrology tool MT, as part of the feedback loop or by any other tools used in the manufacturing process.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer, reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. These gratings diffract radiation that is captured by measurement optics. The design of the measurement optics may be such that the wavelength used by the scatterometer and the NA of the optics can capture diffraction orders from the metrology targets so that parameters such as pitch and line-width of the gratings can be determined. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and not yet published U.S. patent application Ser. No. 15/181,126, incorporated herein by reference in its entirety.

As an alternative to optical metrology methods, it has also been considered to use soft X-rays or EUV radiation, for example radiation in a wavelength range between 0.1 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which contents are incorporated herein by reference in their entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common.

Figure 4:
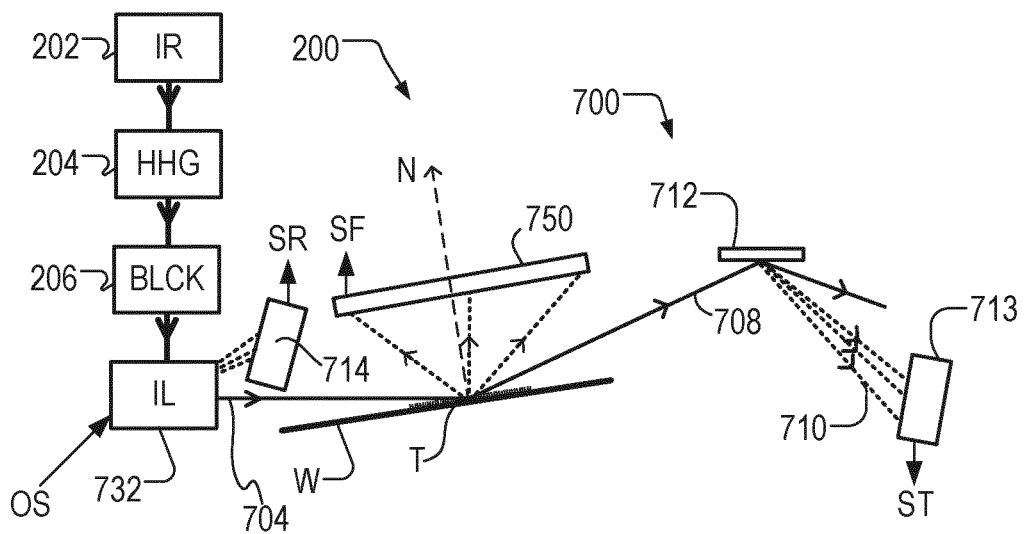
FIG. 4 depicts a schematic representation of a metrology apparatus that uses radiation in the soft X-ray or EUV spectral range.

FIG. 4 shows a metrology apparatus 200 that may use soft X-ray or EUV radiation to determine characteristics of a substrate, for example, characteristics of a target T on a wafer W. The metrology apparatus 200 comprises an Infrared (IR) laser 202, a HHG mechanism 204, an optional IR blocking element 206, an illumination sub-system 732 that may comprise a reference detector 714, a higher order detector 750, and a spectrometer 700. The illumination sub-system 732 comprises an optical system OS, examples of which are described in further detail herein.

The IR laser 202 seeds the Higher Harmonic Generation (HHG) mechanism 204. The IR laser 202 generates short drive pulses of IR radiation that are focused within the HHG mechanism 204 in a HHG medium. The HHG medium may be a gas. The HHG medium converts a portion of the IR radiation towards soft X-ray and/or EUV radiation having according to the Higher Harmonic Generation principle. Compact sources of SXR radiation include HHG sources, in which infrared pump radiation from a laser is converted to shorter wavelength radiation by interaction with a gaseous medium. HHG sources are available for example from KMLabs, Boulder Colorado, USA (http://www.kmlabs.com/).

The generated soft X-ray and/or EUV radiation enters the illumination sub-system 732. Before entering the illumination sub-system, the optional IR blocking element 206 may block a substantial portion of the IR drive beam. The illumination sub-system 732 may comprise a reference measurement branch that comprises the reference detector 714 that generates a reference measurement signal SR. The reference detector 714 may be part of a spectrometer that measures the intensities of the difference wavelengths in the generated soft X-ray and/or EUV radiation.

The metrology apparatus 200 may comprise a sub-system to receive and hold a substrate at a specific position, such as, for example the wafer W. In an embodiment, the sub-system is a wafer table. The wafer W may comprise a target T of which one or more characteristics may be determined. The illumination sub-system 732 is arranged to direct, in use, illumination radiation 704 onto the target T on the wafer W and the illumination sub-system 732 may be arranged to focus the illumination radiation 704 onto the target T.

The target T, or any other structure on the wafer W, may scatter or diffract the illumination radiation 704. The reflected radiation 708 (i.e. the specularly reflected radiation) is received by spectrometer 700. The spectrometer may comprise grating 712 which reflected radiation 708 into a reflection spectrum 710 of different wavelengths. The reflection spectrum 710 is captured by detector 713 which generates a reflection measurement signal ST. Higher-diffraction-order radiation from the target T impinges on the higher-order detector 750 which generates a higher-order measurement signal SF.

Some or all of the apparatus 200 may be evacuated, and the evacuated region may include the wafer W.

The metrology apparatus 200 may comprise a processor (not shown) and/or controller that receives the reference measurement signal SR, the higher order measurement signal SF and/or the reflection measurement signal ST. The processor and/or controller may be arranged to process these signals to determine a measurement value of the property of interest of the target T. Optionally, the processor and/or controller may also control the generation of soft X-ray and/or EUV radiation by controlling the IR laser 202 and/or the HHG mechanisms 204. The processor and/or controller may also control a sub-system that receives and holds the wafer W.

Hereinafter an optical system and a further optical system are discussed that are suitable to focusing a beam of radiation on a region of interest comprising the target T. The discussed optical systems may be used in the illumination sub-system 732 of the metrology apparatus 200. Please note that it may also be used in an inspection apparatus that comprises a source of illumination radiation and a substrate table to receive and hold a substrate.

Potential requirements on the optical system OS or a further optical system OS can be summarized in five items: the optical system OS may focus radiation in the soft X-ray or EUV spectral range, the optical system OS may focus radiation that has a broadband character (or, comprises multiple wavelength peak in a relatively broad spectrum, or has a narrowband character but allows selection of the central wavelength e.g. by using an adjustable monochromator), the optical system OS may have relatively large demagnification with a diffraction limited focus, the optical system OS may fit within a relatively small volume such that the metrology apparatus has a relatively small footprint, and the optical system OS may use a reference grating of a reference measurement branch. As described further herein, the demagnification of an optical system may be defined by a ratio between an apparent source dimension and a corresponding beam spot dimension at the region of interest, wherein the optical system images the apparent source onto the region of interest to form the beam spot.

In an embodiment, one or more reflectors are used for manipulating the beam of radiation B generated by a source. The radiation may impinge at grazing angles of incidence or near normal incidence on the reflectors. It will be understood that the term "reflector" may comprise or refer to a reflector. In some embodiments, at least one reflector may comprise a reflective element, which may function as a reflector. In some embodiments, at least one reflector may comprise a diffractive element, which may function to at least one of: reflect, diffract and scatter radiation. Thus, the diffractive element may also function as a reflector and diffract radiation. Where the term "reflector" or "mirror" is used herein, this may be understood as referring to the general term "reflector".

Radiation in the EUV and SXR ranges is difficult to direct or focus, as the use of a refractive optical element for such wavelengths can only be applied to some very specific applications (e.g. a Fresnel zone plate). For most applications, direction and focusing of EUV and soft X-rays has therefore to be performed using reflectors. Such reflectors may comprise, for example, grazing incidence (e.g. approximately 15 degrees or less with respect to the surface) reflectors, or narrow band multi-layer coated near-normal incidence reflectors (often called Bragg mirrors). Because of the very short wavelengths of EUV and soft X-ray radiation, figure error, slope error and surface roughness requirements of reflectors of such radiation are very strict in order to focus light with low wavefront aberrations and flare from surface scatter due to surface imperfections. The surface quality of such reflectors is typically specified on different length scales, either by a Power Spectral Density (PSD), or in a more compact way by referring root mean squared (RMS) integrated values in three different regimes: very low spatial frequencies or figure errors (typically spatial frequencies close to the size of the beam footprint or clear aperture and/or $<1$ mm$^{-1}$), mid spatial frequencies or slope errors (typically 0.1 mm$^{-1}$ to 1 mm$^{-1}$) and high spatial frequencies or roughness (typically $>1$ mm$^{-1}$). The exact definition of these regimes is often application driven.

As such, to focus the radiation, high-precision optical reflectors are required, having a very low surface roughness (e.g., less than of 0.1 nm RMS), low slope error (e.g. below 1 µrad RMS) and low figure errors (e.g. below 1 nm peak-to-valley). In addition, reflector substrates should comprise materials with low-thermal-expansion, as EUV radiation is readily absorbed and converted into heat. Present methods for manufacturing such reflectors comprise advanced polishing techniques on substrates, optionally followed by applying one or more coatings. The coating may comprise, for example, iridium, ruthenium, gold, or a multilayer stack such as molybdenum-silicon, or any other appropriate coating. The substrate surface is made very smooth by polishing; and to achieve the necessary smoothness, an advanced polishing technique, or super polishing technique, may be used. Such a super polishing technique may comprise Magnetorheological Finishing (MRF), Ion Beam Figuring (IBF) or Elastic Emission Machining (EEM). In MRF, a slurry of magnetic particles in suspended in a carrier fluid is used for polishing, which allows some properties of the fluid to be controlled using a magnetic field. IBF is based on the impingement of ions onto the substrate surface, which transfer some of their energy to atoms on the surface, causing them to be ejected from the solid; this process is also known as sputtering. EEM comprises a non-contact machining process where fine powder particles are brought to the mirror surface by a water flow. Interaction between the surface atoms (with a preference for clusters of atoms, or peaks, which stick out of the surface), results in the removal of surface atoms, smoothing the surface on the atomic scale.

While such manufacturing techniques, employing MRF, IBF or EEM, are shown to be effective for manufacturing reflectors for radiation in the EUV and SXR ranges, they are difficult, expensive, and time-consuming. This is particularly the case when the surface being polished is not flat. Polishing processes that lead to low roughness also have a very low material removal rate. This makes it very time-consuming to remove larger volumes, for example to improve the surface quality in the mid or low spatial frequencies. Moreover, improving the mirror surface on the mid or low spatial frequencies is a deterministic process. This means that, in an iterative process, the surface is measured by a surface metrology tool, like a white light interferometer, and the resultant data is fed into the polisher to selectively remove material in areas where so desired. Surface metrology is increasingly difficult to perform on substrates with a larger curvature and is thus severely limiting the maximum curvature of mirrors that can be polished to the surface quality required at EUV or SXR wavelengths. Therefore an improved, simpler method for manufacturing such reflectors will now be described.

The proposed method comprises a decoupling of the polishing/smoothing step from the shaping of the reflector to obtain a necessary contour. It is proposed to polish a flat surface until very smooth, which can be done using known techniques, and then shaping the reflector to create the curvature in the reflector surface. Creating the curvature and creating a very smooth surface therefore become independent steps. Such a method takes advantage of the relative simplicity of smoothing a flat surface compared to smoothing a curved surface having a specifically defined contour.

It is proposed that the method comprises bonding together a set of flat substrates, such as silicon substrates or wafers. For example, the substrates may be essentially similar to those subject to exposure, etching and dicing in IC manufacture. In an embodiment, the individual substrates can be initially thinned to support the required curvature, where it is deemed necessary to do so (e.g., depending on the degree of curvature required).

Figure 5:
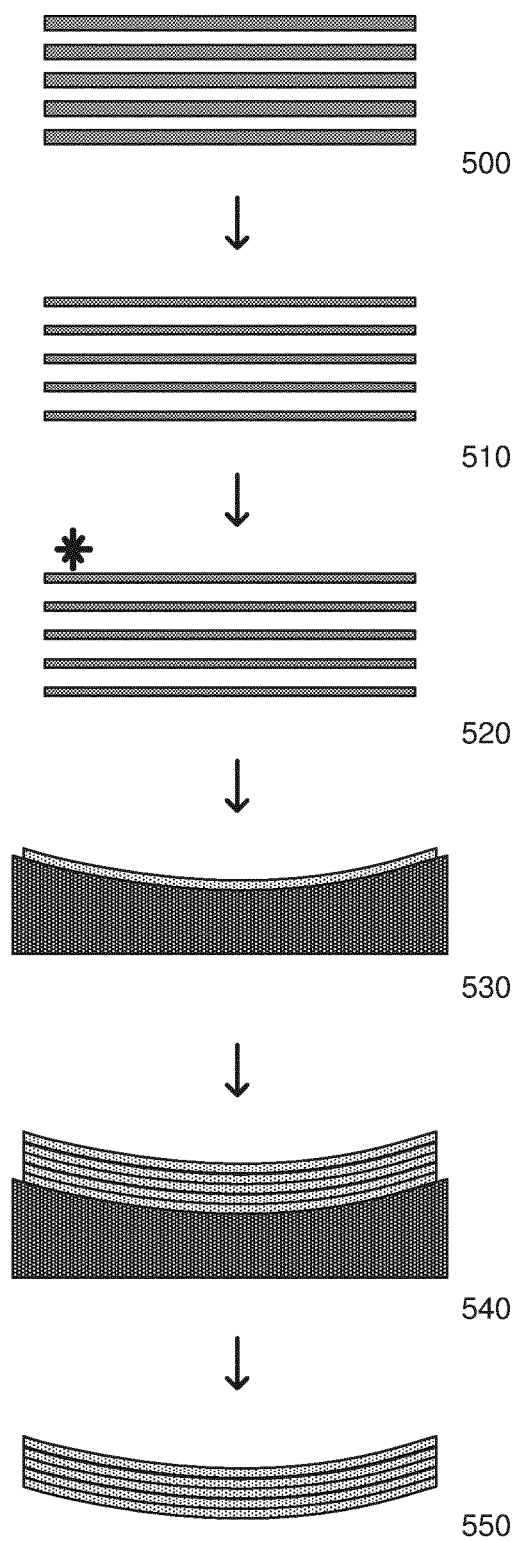
FIG. 5 depicts a flow diagram of a proposed method of manufacturing a reflector according to an embodiment of the invention.

FIG. 5 conceptually illustrates the proposed manufacturing process. At step 500, a plurality of silicon substrates are obtained. At optional step 510, the silicon substrates may be made thinner. This step may be performed by, for example, wafer backgrinding, or etching.

At step 520, the top surface of at least one substrate (i.e., the main, uppermost, reflective surface when the substrates are bonded) is polished to the required degree. This step may comprise polishing the top surface of the substrate which will be at the top of the stack to the greatest degree, whereas the other surfaces need to be polished only to the degree necessary for the chosen bonding process (and may not need polishing at all if the bonding process is adhesive based). It is very advantageous to polish the surfaces while they are still flat, as it is much more difficult to polish curved surfaces. In addition to roughness, also the thickness uniformity across the substrates should be controlled during the polishing step. Each substrate should have a very uniform thickness, because a thickness variation will lead to a shape variation of the reflector surface.

Any of the aforementioned polishing or super polishing techniques may be used for at least the main, uppermost surface. The other bonding surfaces could use less extensive polishing techniques, for example, using wafer polishing tools and apparatuses already used for wafer preparation in IC manufacturing. For example, a Chemical Mechanical Polishing (CMP) may be used for the bonding surfaces.

At steps 530 and 540, the substrates are shaped, stacked and bonded together. In a specific embodiment, this may comprise shaping and bonding each substrate to the stack individually using a cold-bonding, direct bonding or fusion bonding technique (i.e., without adhesive). Direct bonding describes a wafer bonding process without any additional intermediate layers. The bonding process is based on the formation of chemical bonds between two surfaces, meeting numerous requirements, of a material (such as silicon) when they are brought together. The surface requirements for bonding include that the wafer surface is sufficiently clean, flat and smooth. As such, where direct bonding is used, the aforementioned polishing step may comprise polishing of all substrates to facilitate such bonding. The direct bonding may comprise the steps of pre-bonding at room temperature and annealing at an elevated temperature.

As such, the method may comprise placing a first substrate in the mold and applying sufficient force such that it is shaped by the mold 530. The next substrate is then placed on top of the shaped first substrate, such that it also is shaped by the mold and bonds with the first substrate. This is then repeated for all of the substrates. The mold illustrated here is a positive mold, i.e. the shape of the mold is copied to the final reflector shape, rather than a negative mold which would lead to an inversion of the curvature. Either type of mold can be used.

Finally the bonded substrates are released from the mold (step 550). The end result is similar to a bent silicon mirror, but without the active support needed to maintain its shape, and with an infinitely high number of support points. The mold can then be reused for manufacturing another reflector. In an embodiment, the final reflector may have some and preferably all of the following qualities: a very low surface roughness (e.g., less than of 0.1 nm RMS), low slope error (e.g. below 1 µrad RMS) and low figure errors (e.g. below 1 nm peak-to-valley).

It should be appreciated that the bonded substrates might deform somewhat when they are released from the mold. The shape of the mold should therefore comprise a pre-correction for this deformation. This may comprise, for example, modeling the deformation after release (e.g., using a Finite Element Modeling package or similar) and calculating an optimal corrected mold shape for the desired reflector shape.

It should be appreciated that the method described here is purely exemplary and, different bonding, polishing and/or molding techniques may be used. Alternatively, or in addition, where logical or possible, the order of any process step may be changed. The manufacturing process is not necessarily a linear process, and steps may be performed in parallel and/or in another order if there is no direct dependency between the steps.

The proposed method, and in particular the use of flat silicon wafers in the manufacture of the reflector, can bring additional benefits. For example, the proposal opens up the option of patterning a grating on the top layer when the wafer is still flat, for example to create a spectrometer grating. In another example, the patterned grating may comprise a variable line space (VLS) grating; e.g. for shaping into a flat field spectrometer. The patterning of such a grating may be performed using a lithographic apparatus or scanner such as illustrated in FIG. 1, or alternatively using holographic techniques rather than lithography, or alternatively using an optical or e-beam based direct write lithographic process.

It is possible to functionalize one or more of the wafer layers with actuators to deform the mirror. As each of the layers should maintain a well-defined and uniform thickness, in an embodiment such actuators may be embedded in one or more of the substrates. Such actuators can also be used to correct residual manufacturing errors (e.g. slope errors or figure errors), for example those deriving from thickness variations of the component substrates. Alternatively, or additionally, the actuators can be used to impose additional (e.g., figure) components to the surface shape that were not present in the mold. For example the actuators could add 2D freeform corrections on top of the shape (e.g, a cylindrical shape), which was imposed by the bending process using the mold. For complex shapes, it can be convenient to think of the shape of an optical surface as a sum of various shapes, or figure components In principle, control and correction at lateral length scales down to sub-mm should be achievable.

Actuators could comprise, for example, thermal or piezoelectric actuators. Of these, thermal actuators would be easier to integrate into standard wafer processing techniques, as these are simple resistive elements. However, applying such thermal actuators requires careful management of both mechanical stresses and thermal gradients within the substrates. On the other hand, piezo-electric actuators could enable more fine-grained control, as there are no thermal gradients which need to be maintained, but require stronger electric fields and more exotic materials.

It is also possible to embed an image sensor inside the reflector. Such a sensor can be used, for example, to detect the beam footprint. It is additionally possible to provide additional coatings per pixel, to yield spectral information. A simple example would be to cover some of the pixels with a thin layer of zirconium, and others with a layer of aluminum, which have very different transmission characteristics from 5-50 nm. Many more materials could be used, for example boron, silicon, molybdenum, ruthenium. A second class of examples comprises applying periodic multilayer stacks, for example a MoSi multilayer, which can be tuned to suppress a selected narrowband spectrum. Even more complex stacks can be envisioned, e.g. aperiodic multilayers, multilayers terminated with several capping layers, etc. These are only a few examples, many others can be envisaged. Such a sensor may be useful for advanced dose control (including pupil resolved and spectral information) e.g., in a scanner or metrology tool.

Further embodiments are disclosed in the subsequent numbered clauses:

1. A method of manufacturing a reflector comprising:
   polishing at least the uppermost surface of the uppermost substantially flat substrate of a plurality of substantially flat substrates;
   deforming each substantially flat substrate into the desired shape, and
   bonding the deformed substrates together to form said reflector.
2. A method as defined in clause 1, wherein the deforming and bonding steps are performed together using a mold.
3. A method as defined in clause 2, wherein the deforming and bonding steps comprise repetitions of, for each substrate:
   individually deforming the substrate in the mold; and
   bonding the substrate to the preceding substrate to form a stack defining said reflector.
4. A method as defined in clause 3, comprising forming said mold with a pre-correction for additional deformation of the bonded substrates due to their release from the mold.
5. A method as defined in any preceding clause, wherein said bonding of the substrate comprises a fusion bonding method performed without adhesive.
6. A method as defined in clause 5, comprising polishing all bonding surfaces of said substantially flat substrates to facilitate said fusion bonding method.
7. A method as defined in clause 6, wherein said uppermost surface of the uppermost substrate is polished to a higher standard than the other bonding surfaces.
8. A method as defined in clause 7, wherein said other bonding surfaces are polished using a chemical Mechanical Polishing method.
9. A method as defined in any preceding clause, wherein said method is such that the reflector has at least some of the following qualities: a surface roughness less than of 0.1 nm RMS, a slope error below 1 µrad RMS and figure errors below 1 nm peak-to-valley.
10. A method as defined in any preceding clause, wherein the substrates comprise silicon substrates.
11. A method as defined in any preceding clause, wherein the polishing of at least the uppermost surface of the uppermost substrate is performed using a Magnetorheological Finishing, Ion Beam Figuring or Elastic Emission Machining process.
12. A method as defined in any preceding clause, comprising the step of thinning said substrates, prior to the bonding step.
13. A method as defined in any preceding clause, comprising the step of patterning a grating on the top layer prior to uppermost surface of the uppermost substantially flat substrate, prior to said deforming step.
14. A method as defined in clause 13, wherein said grating comprises a spectrometer grating.
15. A method as defined in clause 13, wherein said grating comprises a variable line space grating; for a flat field spectrometer.
16. A method as defined in clause 13, 14 or 15, wherein the step of patterning a grating is performed using a lithographic apparatus.
17. A method as defined in clause 13, 14 or 15, wherein the step of patterning a grating is performed using holographic techniques.
18. A method as defined in any preceding clause, comprising embedding at least one actuator in one or more of the substantially flat substrates, said actuator being operable to deform the reflector.
19. A method as defined in clause 18, wherein said actuators are operable to correct for residual manufacturing errors.
20. A method as defined in clause 18 or 19, wherein said actuators are operable to impose additional figure components such as freeform corrections.
21. A method as defined in clause 18, 19 or 20, wherein said actuators comprise thermal actuators embedded within the bonded substrate.
22. A method as defined in clause 18, 19 or 20, wherein said actuators comprise piezo-electric actuators.
23. A method as defined in any preceding clause, comprising embedding an image sensor within the reflector.
24. A method as defined in clause 23, wherein the image detector is operable to detect a footprint of a beam incident thereon.

25. A method as defined in clause 23 or 24, wherein the image detector comprises a plurality of coatings per pixel, being operable to yield spectral information from a beam incident thereon.

26. A reflector manufactured according to the method of any preceding clause.

27. An illumination sub-system comprising at least one reflector as defined in clause 26.

28. A metrology apparatus comprising an illumination sub-system as defined in clause 27.

29. A lithography apparatus comprising an illumination sub-system as defined in clause 27.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference is made in this text to "metrology apparatus", this term may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

In the context of the above document the term HHG or HHG source is introduced. HHG refers to High Harmonic Generation or sometimes referred to as high order harmonic generation. HHG is a non-linear process in which a target, for example a gas, a plasma or a solid sample, is illuminated by an intensive laser pulse. Subsequently, the target may emit radiation with a frequency that is a multiple of the frequency of the radiation of the laser pulse. Such frequency, that is a multiple, is called a harmonic of the radiation of the laser pulse. One may define that the generated HHG radiation is a harmonic above the fifth harmonic and these harmonics are termed high harmonics. The physical process that forms a basis of the HHG process is different from the physical process that relates to generating radiation of the lower harmonics, typically the 2nd to 5th harmonic. The generation of radiation of the lower harmonic relates to perturbation theory. The trajectory of the (bound) electron of an atom in the target is substantially determined by the Coulomb potential of the host ion. In HHG, the trajectory of the electron that contributes to the HHG process is substantially determined by the electric field of the incoming laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). Another way of phrasing a difference between HHG and the generation of radiation of the lower harmonic is to define that all radiation with photon energy above the ionization energy of the target atoms as "High Harmonic" radiation, e.g. HHG generated radiation, and all radiation with photon energy below the ionization energy as non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

Throughout this disclosure and where appropriate, the term "reflected radiation" may be considered to refer to "specularly reflected radiation". Throughout this disclosure and where appropriate, the term "diffracted radiation" may be considered to refer to 1st or higher-diffraction-order radiation.

Some embodiments described herein refer to an optical system OS comprising first, second and third reflectors, m1, m2 and m3. In such embodiments, the second and third reflectors m2 and m3 may respectively refer to examples of an additional reflector and a further additional reflector. Some embodiments described herein refer to an optical system OS comprising first, second, third and fourth reflectors, m1, m2, m3 and m4. In such embodiments, the third and fourth reflectors m3 and m4 may respectively refer to examples of an additional reflector and a further additional reflector.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of manufacturing a reflector, the method comprising:
    polishing at least an uppermost surface of an uppermost substantially flat substrate of a plurality of substantially flat substrates, wherein bottom surfaces of the plurality of substantially flat substrates are flat;
    deforming each of the plurality of substantially flat substrates into a desired shape of deformed substrates; and
    bonding the deformed substrates together to form the reflector,
    wherein the uppermost surface of the uppermost substantially flat substrate is polished to a higher value than other bonding surfaces.

2. The method of claim 1, wherein the deforming and bonding are performed together using a mold.

3. The method of claim 2, wherein the deforming and bonding comprise repetitions of, for each substrate:
    individually deforming each substrate in the mold; and
    bonding each substrate to a preceding substrate to form a stack defining the reflector,
    wherein the method further comprises forming the mold with a pre-correction for additional deformation of the bonded substrates due to their release from the mold.

4. The method of claim 1, wherein the bonding of the plurality of substantially flat substrates comprises a fusion bonding method performed without adhesive.

5. The method of claim 4, further comprising polishing all bonding surfaces of the substantially flat substrates to facilitate the fusion bonding method.

6. The method of claim 5, wherein:
the other bonding surfaces are polished using a chemical mechanical polishing method.

7. The method of claim 1, wherein the method achieves at least one of: a surface roughness less than 0.1 nm RMS, a slope error below 1 μrad RMS, and figure errors below 1 nm peak-to-valley.

8. The method of claim 1, wherein the polishing of at least the uppermost surface of the uppermost substrate is performed using a Magnetorheological Finishing, Ion Beam Figuring or Elastic Emission Machining process.

9. The method of claim 1, further comprising thinning the substrates prior to the bonding step.

10. A method of manufacturing a reflector, the method comprising:
polishing at least an uppermost surface of an uppermost substantially flat substrate of a plurality of substantially flat substrates, wherein bottom surfaces of the plurality of substantially flat substrates are flat;
deforming each of the plurality of substantially flat substrates into a desired shape of deformed substrates;
bonding the deformed substrates together to form the reflector; and
prior to the deforming step, patterning a variable line space grating for a flat field spectrometer on the uppermost surface of the uppermost substantially flat substrate.

11. The method of claim 1, further comprising embedding at least one actuator in one or more of the substantially flat substrates, the actuator being operable to deform the reflector, and
wherein the at least one actuator comprises a thermal actuator embedded within a bonded substrate.

12. The method of claim 1, further comprising embedding an image sensor within the reflector, and
wherein the image sensor is operable to detect a footprint of a beam incident thereon.

13. A reflector for a metrology apparatus manufactured according to the method of claim 1.

14. A metrology apparatus comprising an illumination sub-system comprising at least one reflector manufactured according to the method of claim 13.

* * * * *